(12) United States Patent
Teh et al.

(10) Patent No.: US 6,815,823 B2
(45) Date of Patent: Nov. 9, 2004

(54) COPPER METAL STRUCTURE FOR THE REDUCTION OF INTRA-METAL CAPACITANCE

(75) Inventors: Young-Way Teh, Singapore (SG); Victor Seng Keong Lim, Singapore (SG); Ting Cheong Ang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/679,736

(22) Filed: Oct. 6, 2003

(65) Prior Publication Data

US 2004/0065956 A1 Apr. 8, 2004

Related U.S. Application Data

(62) Division of application No. 09/859,353, filed on May 18, 2001, now Pat. No. 6,649,517.

(51) Int. Cl.⁷ .............................................. H01L 23/48
(52) U.S. Cl. .................... 257/758; 257/762; 257/774; 257/775
(58) Field of Search .......................... 257/758, 762–766, 257/771, 774, 775

(56) References Cited

U.S. PATENT DOCUMENTS

| 4,888,087 | A |   | 12/1989 | Moslehi et al. | 156/643 |
|---|---|---|---|---|---|
| 5,109,267 | A |   | 4/1992 | Koblinger et al. | 357/54 |
| 5,821,141 | A |   | 10/1998 | Huang | 438/253 |
| 6,037,248 | A | * | 3/2000 | Ahn | 438/619 |
| 6,103,619 | A |   | 8/2000 | Lai | 438/638 |
| 6,114,243 | A |   | 9/2000 | Gupta et al. | 438/687 |
| 6,607,976 | B2 | * | 8/2003 | Chen et al. | 438/627 |
| 6,709,987 | B2 | * | 3/2004 | Hashim et al. | 438/722 |

* cited by examiner

*Primary Examiner*—Thanh Nguyen
(74) *Attorney, Agent, or Firm*—George O. Saile; Rosemary L. S. Pike

(57) ABSTRACT

A new method and structure is provided for the creation of interconnect lines. The cross section of the interconnect lines of the invention, taken in a plane that is perpendicular to the longitudinal direction of the interconnect lines, is a triangle as opposed to the conventional square or rectangular cross section of interconnect lines.

5 Claims, 6 Drawing Sheets

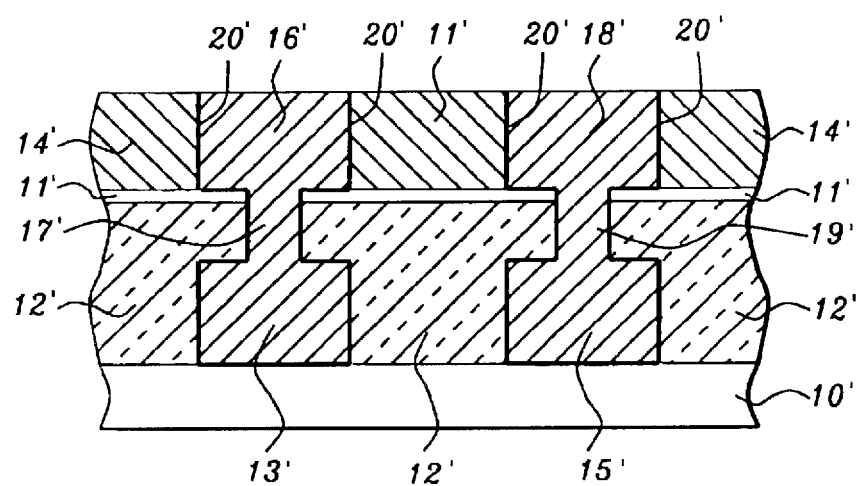
FIG. 13 — Prior Art

COPPER METAL STRUCTURE FOR THE REDUCTION OF INTRA-METAL CAPACITANCE

This is a division of patent application Ser. No. 09/859,353, filing date May 18, 2001, now U.S. Pat. No. 6,649,517, Novel Copper Metal Structure For The Reduction Of Intra-Metal Capacitance, assigned to the same assignee as the present invention.

BACKGROUND OF THE INVENTION (1) Field of the Invention

The invention relates to the fabrication of integrated circuit devices, and more particularly, to a method and structure for the creation of interconnect patterns that reduce intermetal capacitance for sub-micron device features.

(2) Description of the Prior Art

In the creation of monolithic integrated circuits numerous interacting electrical device elements are typically created in or on the surface of a semiconductor substrate. Among these device elements are transistors, diodes, bipolar transistors of either NPN or PNP conducting characteristics, Field Effect Transistors of either N or P channel type. After these device elements have been created, these elements must be interconnected in order to form functional semiconductor devices such as analog or digital circuits, flip-flop circuits and memory circuits. From there, the interconnected device elements are further connected to surrounding circuitry, circuit substrates, printed circuit boards and the like.

Semiconductor device performance improvements are typically achieved by a continuing reduction in the dimensions of the device elements. This results in increased device density and increased proximity of device elements that belong to one device or to several, adjacent devices. In order to achieve functional operability of the semiconductor device, none-interactive or interconnected device elements must be insulated from each other. It is well known in the art how to interconnect device elements that reside in or on a single level. As part of the creation of semiconductor devices on one level, these devices are electrically insulated and electrically connected to surrounding electronic components by means of holes that are created in the layer of insulation that surrounds the devices and the device elements. The devices or the device elements are accessed through these holes and further interconnected by (first) conductive interconnecting lines that are created on the surface of a (first) layer of insulating material.

In view of the continuing increase in circuit density, multiple layers of devices or device elements are frequently superimposed over each other by first depositing a second layer of insulating material over the interconnecting lines that have been created on the surface of the first layer of insulation. Holes are created in the second layer of insulation for connections to the first network of interconnecting lines, which can then be followed by creating a (second) network of conductive interconnect lines on the surface of the second layer of insulation. It is clear that this process can be repeated a number of times and is limited not by the nature of the process but by the electrical performance characteristics that are imposed as a consequence of the method of interconnecting semiconductor devices.

It is easy to visualize that, with decreased device dimensions, interconnect lines and networks can quickly deteriorate into very complex structures. This may not be a disadvantage in and of itself but this may, in practical terms, impose severe restrictions on the electrical performance of the assembled package. This limitation becomes even more stringent as the operational frequency of the package increases.

The material of choice for the creation of interconnect lines has for many years been aluminum. While doped polycrystalline silicon can be used for some circuit interconnections, virtually all semiconductor circuits use at least one layer of metal interconnection lines. Such metal interconnection lines are typically formed by depositing a thin film of aluminum or aluminum-copper alloy on the wafer, masking the aluminum layer with resist to define a set of metal interconnection lines, and then anisotropically etching the portions of the metal layer not covered by resist. Reactive ion etching (plasma etching) of metal thin films is usually performed using a plasma in which the wafer is bombarded with ions that react with and remove the exposed regions of metal. Plasma etching is performed in a vacuum chamber, and the etcher's vacuum pumping system removes most, but not all, of the reaction products. Advantages of plasma ion etching over conventional wet etching processes include the possibilities of process automation, less undercutting of wall profiles and higher packing density.

Copper has in recent times found increased application in the use of metal wires due to its low resistivity, high electromigration resistance and stress voiding resistance. Copper however exhibits the disadvantage of high diffusivity in common insulating materials such as silicon dioxide and oxygen-containing polymers. This leads to, for instance, the diffusion of copper into polyimide during high temperature processing of the polyimide, resulting in severe erosion of the copper and the polyimide due to the copper combining with oxygen in the polyimide. The erosion may result in loss of adhesion, delamination, voids and ultimately a catastrophic failure of the component. The copper that is used in an interconnect may diffuse into the silicon dioxide layer causing the dielectric to become conductive and also decreasing the dielectric strength of the silicon dioxide layer. A copper diffusion barrier is therefore often required; silicon nitride is often applied as a diffusion barrier to copper. Silicon nitride however has a dielectric constant that is high compared with silicon dioxide thereby limiting the use of silicon nitride in encapsulating copper interconnect lines.

In addition, due to the fact that copper is very difficult to process by RIE, the Chemical Mechanical Polishing (CMP) method may need to be used where copper is used as a wiring material. To polish copper at a high rate without scratching in accordance with the burled wiring formation, the copper etch rate must be raised by increasing the amount of the component responsible for copper etching contained in the polishing slurry. If the component is used in an increased amount, the etching will occur isotropically. Consequently, buried copper is etched away, causing dishing in the wiring. It is, when forming interconnect lines using copper, desirable to use methods that do not depend on patterning the copper lines using a chemical etching process since etching of copper is very difficult and is a process that is only recently being further investigated. The use of copper as a metal for interconnect wiring is further hindered by the susceptibility of copper to oxidation. Conventional photoresist processing cannot be used when copper is to be patterned into various wire shapes. The photoresist needs to be removed at the end of the process by heating it in a highly oxidized environment, such as an oxygen plasma, thereby converting it to an easily removed ash.

The above highlighting of some of the advantages and disadvantages of the use of copper indicates that copper has been receiving a relatively large amount of attention as a material to be used for the creation of conductive interconnects. This to the point where in sub-micron technology copper is extensively used in the fabrication of semiconductor devices. For the vast majority of these applications, interconnect lines are created whereby the cross section of the interconnect lines has a rectangular or square shape. With the sharp decrease in the distance between adjacent copper interconnect lines (the metal pitch), the interconnect lines which typically have a square or rectangular cross section induce high intra-metal parasitic capacitances which is detrimental to optimum device performance, especially for higher frequency device operation. The invention addresses this aspect of creating interconnect lines and provides a method whereby the parasitic intra-line capacitance is reduced.

U.S. Pat. No. 5,109,267 (Koblinger et al.) shows a sloped metallization (See FIG. 5).

U.S. Pat. No. 4,888,087 (Moslehi et al.), U.S. Pat. No. 6,114,243 (Gupta et al.) and U.S. Pat. No. 6,103,619 (Lai et al.) show interconnect shapes and processes.

U.S. Pat. No. 5,821,141 (Huang) shows a capacitor with a rounded top opening.

SUMMARY OF THE INVENTION

A principle objective of the invention is to reduce intra-metal parasitic coupling between adjacent interconnecting lines.

Another objective of the invention is to achieve high-performance metal interconnect lines without the use of cost intensive processing steps.

Yet another objective of the invention is to provide a method for the creation of high performance interconnect lines that can readily be integrated into conventional semiconductor manufacturing procedures.

In accordance with the objectives of the invention a new method and structure is provided for the creation of interconnect lines. The cross section of the interconnect lines of the invention, taken in a plane that is perpendicular to the longitudinal direction of the interconnect lines, is a triangle as opposed to the conventional square or rectangular cross section of interconnect lines.

BRIEF DESCRIPTION OF THE DRAWINGS

FIG. 1 shows a cross section of the surface of a semiconductor substrate over the surface of which has been deposited a layer of dielectric.

FIG. 2 shows a cross section of the structure of FIG. 1 after a patterned and developed layer of photoresist has been created on the surface of the layer of dielectric.

FIG. 3 shows a cross section during the process of etching the layer of dielectric in accordance with the opening that has been created in the overlying layer of dielectric.

FIG. 4 shows a cross section of the opening that has been created in the layer of dielectric in accordance with the invention.

FIG. 5 shows the cross section of a semiconductor surface, a first layer of dielectric has been deposited over the semiconductor surface, two conductive contact plugs have been created in the first layer of dielectric in accordance with the invention.

FIG. 13 shows a cross section of a conventional interconnect line taken in a plane that is perpendicular to the longitudinal direction of the interconnect line.

DESCRIPTION OF THE PREFERRED EMBODIMENTS

Figure 1:
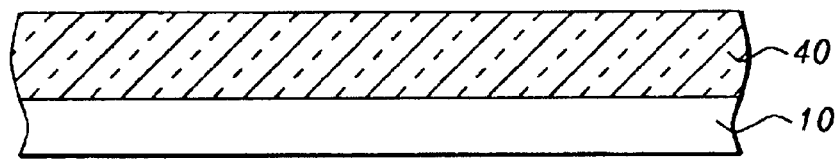
FIGS. 1 through 4 shows the creation of an opening of the invention, as follows.

Conventional interconnect lines will be highlighted first in order to establish a point of reference. For this, referring now specifically to FIG. 13, there is shown a cross section of two conventional interconnect lines 16' and 18'. These interconnect lines have been created on the surface of a layer 10' which typically is the surface of a semiconductor substrate, electrical points of contact 13' and 15' have been provided in or on the surface of layer 10. A first layer 12' of dielectric has been deposited over the surface of layer 10', the points of electrical contact 13' and 15' are, in the cross section that is shown in FIG. 13, embedded in the first layer of dielectric. The points of electrical contact 13' and 15' can also be embedded in the surface of layer 10' in which case holes are created through layer 12', the surface of layer 10' and therewith the points of electrical contact 13' and 15' can then be accessed through these holes. A layer 11' of etch stop material, such as SiN, is deposited over the surface of the first layer 12' of dielectric and patterned and etched. Using this patterned layer 11' of etch stop the openings 17' and 19' are etched into the surface of the first layer 12' of dielectric. The points 13' and 15' of electrical contact can be accessed by means of these openings 17' and 19'. After holes 17' and 19' have been created in the first layer 12' of dielectric, these openings are filled with a conductive material, the deposited conductive material is etched down to the surface of the patterned etch stop layer 11'.

The second layer 14' of dielectric is next deposited over the surface of the etch stop layer 11', thereby including the surface of the openings 17' and 19' that are at this time filled with a conductive material. The second layer 14' of dielectric is patterned and etched, creating openings 16' and 18' in the second layer 14' of dielectric. These openings are next filled with a conductive material, which in turn is polished down to the surface of the second layer 14' of dielectric. The electrical contact plugs 13'/17'/16' and 15'/19'/18' are at this time complete.

It is clear from the cross section that is shown in FIG. 13 that the cross sections of the sections that make up the electrical contact plugs are all either a rectangle or a square. Significant is that the sides of adjacent sections of the electrical contact plugs, such as sections 13' and 15', sections 17' and 19', sections 16' and 18', are parallel with each other. This results in maximum electromagnetic exposure of these sides to their adjacent counterparts such as section 16' having maximum electromagnetic exposure to section 18', section 17' to section 19' and section 13' to section 15'. This clearly results in close electromagnetic coupling between these sections resulting in the existence of high parasitic capacitances between these sections. This parasitic capacitance has, as previously pointed out, a negative impact on device performance and must therefore be minimized or avoided.

FIG. 13 further shows the use of a barrier layer 20' which is frequently applied to negate interaction of the conductive material, such as copper, that is used to fill the plugs 13'/17'/16' and 15'/19'/18', with the surrounding dielectric. This barrier layer 20' typically comprises TaN. Some applications further deposit a seed layer (of for instance copper, not shown) over the surface of the barrier layer 20' in order to enhance adhesion between the conductive material deposited in plugs 13'/17'/16' and 15'/19'/18' and the surrounding dielectric.

FIGS. 1 through 12 address the creation of interconnect lines of the invention.

Specifically, FIG. 1 shows a cross section of a surface 10 over which a layer 40 of dielectric has been deposited. Layers 40 of Intra Metal Dielectric can contain any suitable dielectric such as for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluoride-doped silicate glass.

The most commonly used and therefore the preferred dielectrics that can be used for the deposition of layers 40 are silicon dioxide (doped or undoped), silicon oxynitride, parylene or polyimide, spin-on-glass, plasma oxide or LPCVD oxide. The preferred dielectric material to be used for the invention is $SiO_2$.

The deposition of the layers 40 of dielectric uses conventional deposition technology and can, for instance, be deposited using LPCVD, PECVD, or APCVD procedures at a temperature of between about 350 and 450 degrees C. to a thickness between about 5000 and 10,000 Angstrom using TEOS as a source.

The intra-dielectric material that is typically used to isolate conducting lines from each other is silicon dioxide, which is a thermally and chemically stable material. Continued decreasing of the horizontal dimensions of semiconductor devices leads to layers of metal that tend to have vertical dimensions that are not necessarily reduced accordingly resulting for instance in contact and via openings that have a high aspect ratio. Conventional oxide etching processes and materials are however available for such high aspect ratio contact and via openings. Consideration must be given to the dielectric constant of the dielectrics that are used to isolate conducting lines. The dielectric constant of dense silicon oxide that is grown by thermal oxidation or by chemical vapor deposition is in the order of 3.9, CVD oxide has a relative dielectric constant of about 4.6. The lowest possible and therefore the ideal dielectric constant is 1.0, this is the dielectric constant of a vacuum whereas air has a dielectric constant of slightly larger than 1.0. Dielectric constants of dielectric materials that can be used for intra-level or inter level dielectric material vary, typical values are for instance 4.1–4.5 for inorganic Plasma $SiO_2$, 3.5 for inorganic fluorine doped $SiO_2$ (FSG), 2.7–3.0 for Organic Polysilsequioxane (Si polymer), 2.7 for organic Benzocyclobutene (BCB), etc.

Figure 2:
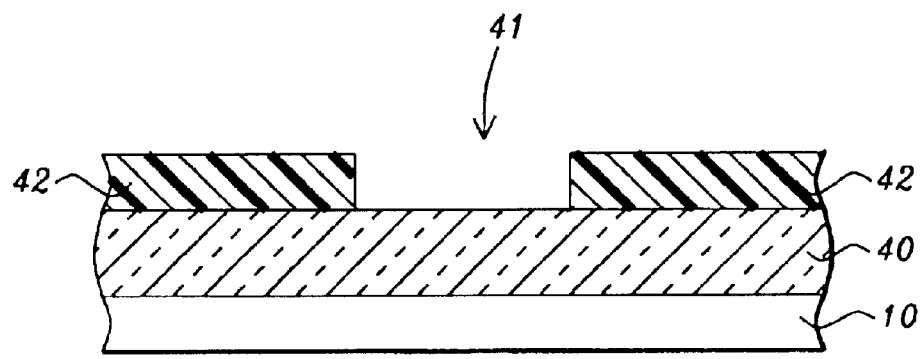

Over the surface of layer 40 of dielectric, FIG. 2, has been deposited a layer 42 of photoresist. Conventional methods of photolithographic exposure and photoresist development have been applied to create opening 41 in layer 42 of photoresist.

Figure 3:
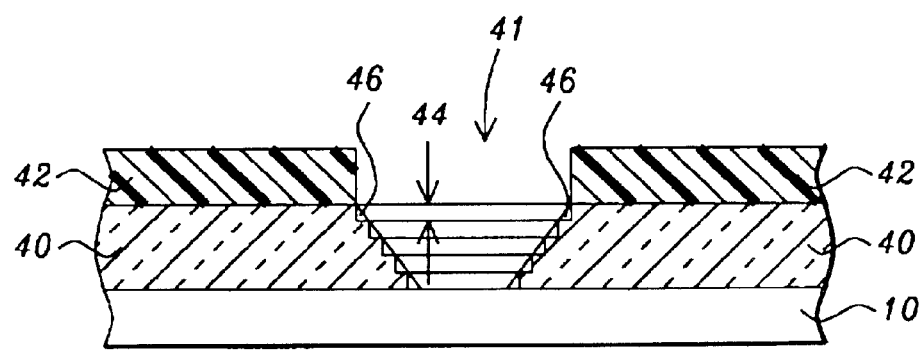

FIG. 3 shows a cross section of the structure of FIG. 3 during the process of etching layer 40 of dielectric in accordance with the pattern of the opening 41 that has been created in the layer 42 of photoresist. This processing step is a key processing step of the invention, since during the processing steps an opening having sloping sidewalls is created in the layer 40 of dielectric. As etching gas for the creation of opening 41 through layer 40 is used $CHF_3+CF_4+O_2$, applied under medium pressure and a temperature in excess of 120 degrees C. The process of the etch is carefully controlled so that tetrafluoride ($CF_4$) serves as the etchant gas, creating the opening through the layer 40 of dielectric while the etchant gas component trifluoromethane ($CHF_3$) provides for the deposition of polymer that is formed during the etch process on the sidewalls of the opening that is being etched by the $CF_4$. The result is the step wise progression of the etching of the opening through layer 40 that is shown in cross section in FIG. 3, specifically the depth is created by the $CF_4$ component of the etchant gas while, during the creation of the opening and as a continuing process, polymer 46 is deposited overlying the sidewalls of the created opening. This deposited polymer 46 protects, during the proceeding and anisotropic etch of the opening through layer 40, the sidewalls of the opening from being attacked by the etch species, resulting in the sloping of the sidewalls of the opening that is created through layer 40. By controlling the polymer deposition rate on the sidewalls of the opening, the slope or etch taper profile of the opening can be controlled. It must be appreciated that the etch of layer 40 essentially proceeds gradually into and through the layer 40, meaning that the deposition of the polymer 46 on the sidewalls of the opening that is being created is also a continuous process, finally resulting in a continuous layer of polymer being created on the sidewalls of the opening. This continuous layer of polymer acts as a retardant of the etch where the polymer is deposited, that is the sidewalls of the opening. It is clear from this that, as a result of this retarding action, the sidewalls of the opening will slope. In order to achieve a slope of about 45 degrees, a very high flow rate of the $CHF_3$ is required since this high flow rate results in a high deposition rate of the polymer on the sidewalls of the opening while this opening is being etched.

The preferred for layer 40 of dielectric are as follows: process applied: anisotropic, RIE processing, etchant gas: $CF_4+CHF_3+O_2$, at a flow rate of about 15 sccm whereby the flow rate of the $CHF_3$ is varied and may be in excess of 200 sccm, temperature in excess of 120 degrees C. and preferably in the range between 120 and 200 degrees C. and more preferably about 150 degrees C., a gas pressure between about 200 and 800 mTorr and more preferably about 500 mTorr, rf power density about 400 watts, no magnetic field applied, time of the etch between about 5 and 50 seconds and more preferably about 25 seconds.

The variation of the flow rate of the $CHF_3$ can be used to adjust the slope of the opening 41 that is created in layer 42 of dielectric. Where it is stated above that the flow rate may be in excess of 200 sccm, it is not unreasonable to expect to vary this flow rate dependent on the slope of the opening 41 that is created in layer 42. The slopes are suggested, whereby the angle that the sidewalls of opening 41 make with the surface of the underlying semiconductor substrate 10 is the independent parameter. The following table can be used for this purpose:

| angle | $CHF_3$ flow rate |
|---|---|
| 60 degrees | between about 10 and 90 sccm |
| 45 degrees | between about 90 and 170 sccm |
| 30 degrees | between about 170 and 250 sccm. |

Figure 4:
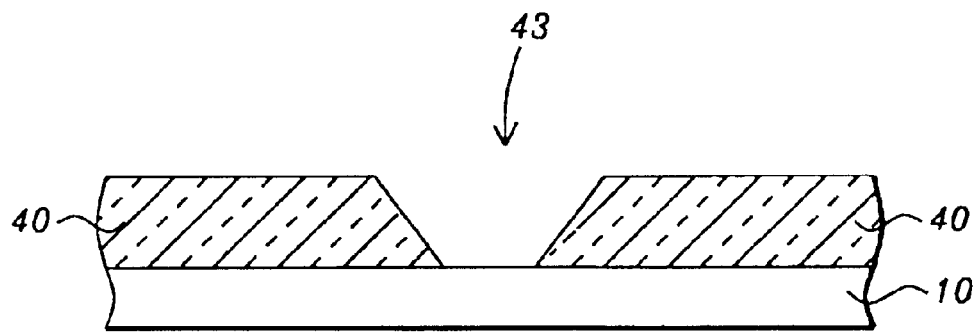

A conductive plug can be created in the opening 42 of FIG. 4 by depositing a layer (not shown in FIG. 4) of conductive material over the surface of dielectric layer 40 and polishing the surface of the deposited layer of conductive material essentially down to the surface of layer 40 of dielectric. The deposition of a layer of metal can be preceded by the deposition of a barrier layer (not show) over the surface of the layer of dielectric, this deposition of a layer of barrier material can be followed by the deposition (not shown) of a seed layer over the surface of the barrier layer prior to the deposition of a layer of metal.

Figure 5:
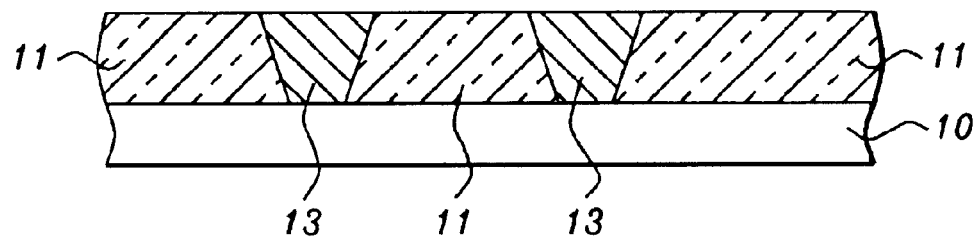
FIGS. 5 though 11 show a process of the invention for the creation of overlying layers of interconnect lines, as follows.

FIGS. 5 though 11 further address the application of the invention.

Referring now specifically to FIG. 5, there is shown a cross section of a semiconductor surface 10, a first layer 11 of dielectric has been deposited over the semiconductor surface 10, two conductive contact plugs 13 have been created in the first layer of dielectric in accordance with the invention. Processing conditions and materials selected for the deposition of layer 11 of dielectric have previously been highlighted under FIGS. 1 through 4 and can be equally applied to create the structure that is shown in cross section in FIG. 5. The preferred material of the invention that is used for the creation of contact plugs 13 is copper.

The points 13 of electrical contact have a cross section that is not rectangular, the cross section that is shown in FIG. 5 of contact points clearly meets the objective of the invention of reducing line to line parasitic capacitance. Interconnect points 13, FIG. 5, are created using the process that has previously been described using FIGS. 1 through 4. The dielectric 11 is etched to form the triangular shape of interconnect points 13, the openings are filled with copper after which a process of CMP polishes the surface of the deposited layer of copper.

Figure 6:
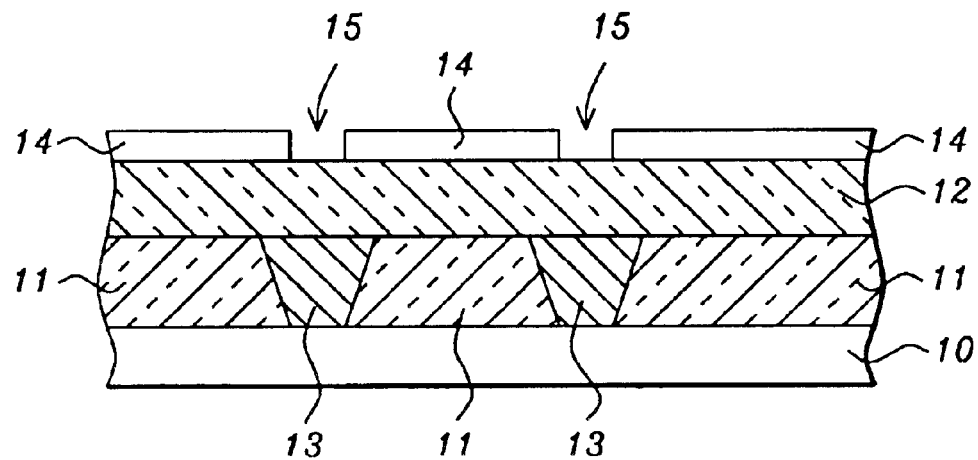
FIG. 6 shows a cross section after the deposition of a second layer of dielectric, a patterned layer of etch stop material has been created on the surface of the second layer of dielectric.

FIG. 6 shows a cross section after the deposition of a second layer 12 of dielectric, a patterned layer 14 of etch stop material has been created on the surface of the second layer of dielectric.

Processing conditions and materials that can be used for the creation of second layer 12 of dielectric are as have previously been indicated for the creation of the first layer 11 of dielectric.

Layer 14 has been created as an etch stop layer for subsequent steps of etching of the first and second layers of dielectric. Silicon nitride is frequently used as a passivation layer due to its ability to provide an impermeable barrier to moisture and mobile impurities (e.g. sodium ions). Silicon nitride also forms a tough coating that protects an underlying integrated circuit against mechanical damage.

The layer 14 of silicon nitride ($Si_3Ni_4$) can be deposited using PECVD procedures at a pressure between about 200 mTorr and 400 mTorr, at a temperature between about 350 and 450 degrees C., to a thickness of about 1000 to 5000 Angstrom using $NH_3$ and $SiH_4$ or $SiCl_2H_2$. The silicon nitride layer 14 can also be deposited using LPCVD or PECVD procedures using a reactant gas mixture such as dichlorosilane ($SiCl_2H_2$) as a silicon source material and amonia ($NH_3$) as a nitrogen source, at a temperature between about 600 and 800 degrees C., at a pressure between about 300 mTorr and 400 mTorr, to a thickness between about 200 and 300 Angstrom.

The stop layer 14 of silicon nitride can be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. Openings in the layer of nitride can be anisotropically etched with a plasma gas containing fluor carbon gases such as $CF_4/CHF_3$ or $SF_6$—$O_2$ chemistry or $CO/C_4F_8$ chemistry, in a commercial RIE etcher or an electron cyclotron resonance (ECR) plasma reactor. A frequently applied method of removing silicon nitride is an isotropic wet etch process using hot phosphoric acid. The silicon nitride layer 14 can also be dipped into phosphoric acid ($H_3PO_4$) to be removed.

It is important to point out in this respect that dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic.

It must be noted from the cross section that is shown in FIG. 6 that the openings 15 that have been created in the etch stop layer 14 align with the underlying points 13 of electrical contact. This is important in view of the conductive interconnects that will be created to these points 13 of electrical contact.

Figure 7:
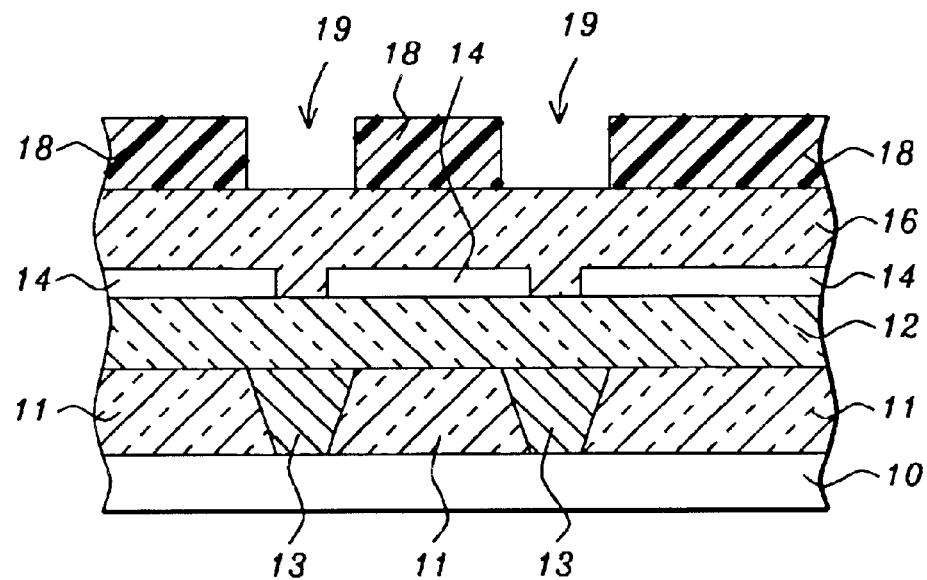
FIG. 7 shows a cross section after a third layer of dielectric has been deposited, a patterned layer of photoresist has been created on the surface of the third layer of dielectric.

FIG. 7 shows a cross section after a third layer 16 of dielectric has been deposited, a patterned layer 18 of photoresist has been created on the surface of the third layer of dielectric.

Processing conditions and materials that can be used for the creation of third layer 16 of dielectric are as have previously been indicated for the creation of the first layer 11 of dielectric.

The layer 18 of photoresist is spin coated over the surface of the third layer 16 of dielectric and patterned as shown. Openings 19 are created in the layer 18 of photoresist that align with the openings 15 that have been created in the etch stop layer 14 and with the pattern of the electrical points of contact 13. The layer 18 of photoresist can be etched by applying $O_2$ plasma and then wet stripping by using $H_2SO_4$, $H_2O_2$ and $NH_4OH$ solution.

A photoresist developer often used during development of the photoresist is tetramethyl ammonium hydroxide (TMAH). Other developers such as sodium hydroxide, sodium metasillicide or potassium hydroxide may also be used. However, one of the properties of TMAH relative to other developers is that it is a metal-ion free developer, which reduces metal-ion diffusion and contamination in other parts of the IC.

Photoresist stripping frequently applies sulfuric acid ($H_2SO_4$) and mixtures of $H_2SO_4$ with other oxidizing agents such as hydrogen peroxide ($H_2O_2$). For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

Figure 8:
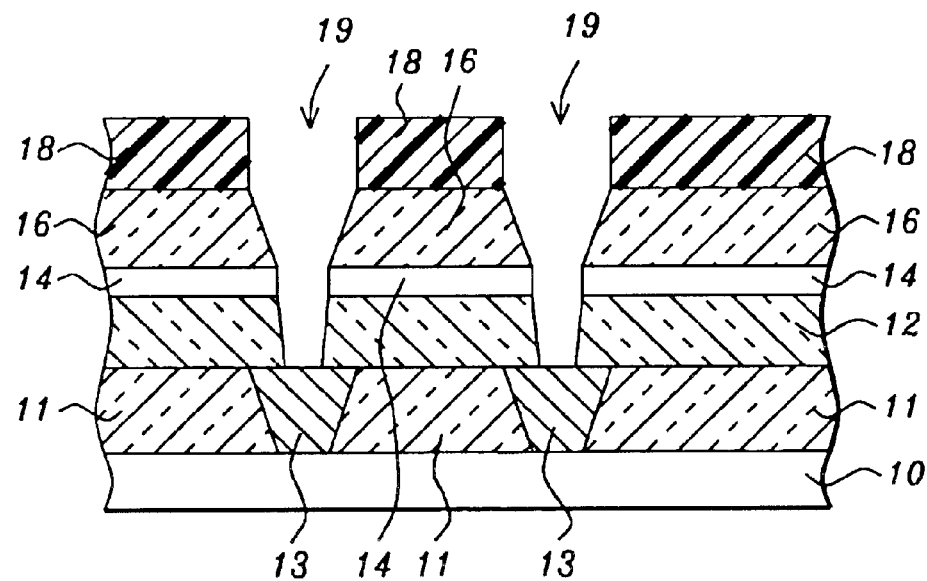
FIG. 8 shows a cross section after openings have been etched through the third layer of dielectric, the etch stop layer and the second layer of dielectric in accordance with the openings that have been created in an overlying developed layer of photoresist.

FIG. 8 shows a cross section after the third layer 18 of dielectric and the second layer 12 of dielectric have been etched in accordance with the openings 19 that have been created in the patterned layer 18 of photoresist and the openings 15 that have been created in the etch stop layer 14. Openings 19 penetrate through both the third layer 16 of dielectric and the second layer 12 of dielectric and partially expose the surface of the points 13 of electrical contact.

The processing conditions that are applied for the etch of the third and the second layers of dielectric that is shown in cross section in FIG. 8 are as previously have been applied for the cross section of FIG. 3, that is:

process applied: anisotropic, RIE processing, etchant gas: $CF_4+CHF_3+O_2$, at a flow rate of about 15 sccm whereby the flow rate of the $CHF_3$ can be varied and may be in excess of 200 sccm, temperature in excess of 120 degrees C. and preferably in the range between 120 and 200 degrees C. and more preferably about 150 degrees C., a gas pressure between about 200 and 800 mTorr and more preferably about 500 mTorr, rf power density about 400 Watts, no magnetic field applied, time of the etch between about 5 and 50 seconds and more preferably about 25 seconds.

The processing conditions that can be applied to remove the patterned and developed layer 18 of photoresist have previously been highlighted and can be equally applied at this time form the removal of layer 18.

It must further be observer that an etch stop layer, not shown in FIG. 8, can further be deposited over the surface of layer 16 of dielectric, this prior to the deposition and development of layer 18 of photoresist. This etch stop layer can be patterned and etched, creating an opening through this etch stop layer that aligns with the contact plugs 13. This etch stop layer provides further control over the etching of the opening through layer 16 of dielectric. The diameter of the opening that is created through this etch stop layer can be selected and further provides a control parameter for the slope of the opening that is created through layer 16 of dielectric.

Figure 9:
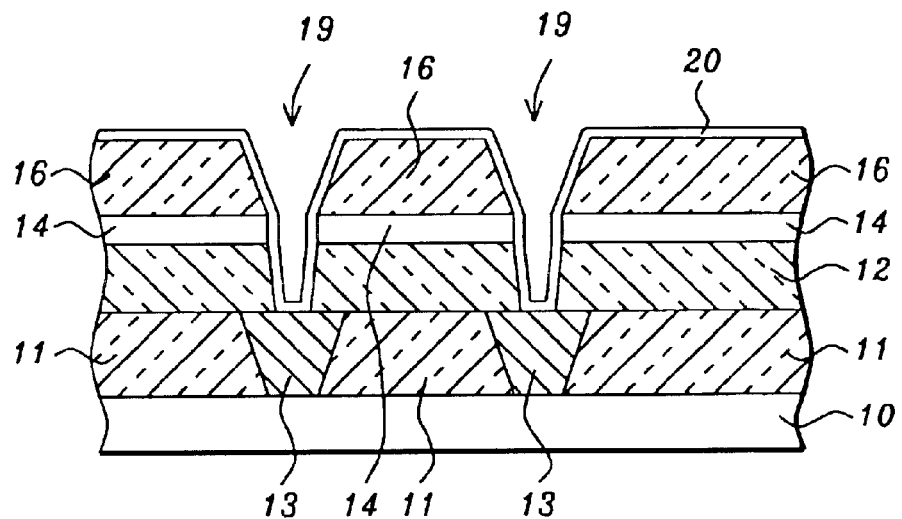
FIG. 9 shows a cross section after the developed layer of photoresist has been removed, a barrier layer has been deposited.

FIG. 9 shows a cross section after the patterned layer 18 (FIG. 8) of photoresist has been removed from the surface and a barrier layer 20 has been deposited into the openings created by the etch of the third and second layers of dielectric.

It has previously been pointed out that a barrier layer is frequently deposited to avoid interaction between copper that is used as the material for interconnect lines and the surrounding layers of dielectric. While copper offers a number of advantages for the use of interconnect lines, copper unfortunately suffers from high diffusivity in common insulating materials such as silicon oxide and oxygen-containing polymers. For instance, copper tends to diffuse into polyimide during high temperature processing of the polyimide. This causes severe corrosion of the copper and the polyimide due to the copper combining with oxygen in the polyimide. This corrosion may result in loss of adhesion, delamination, voids, and ultimately a catastrophic failure of the component. Copper interconnects should therefore be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. A typical barrier layer is deposited using rf. sputtering of titanium nitride, tantalum, tungsten, niobium, molybdenum, Ti/TiN or Ti/W and is more preferably formed from TiN or TaN. The barrier layer can also be used to improve the adhesion of the subsequent overlying copper layer. A barrier layer is preferably about 100 and 500 angstrom thick and more preferably about 300 angstrom thick. The barrier layer that is present at the bottom of openings 24 is removed prior to copper deposition.

It has previously been pointed out that, in order to further enhance the adhesion of a copper interconnect line to the surrounding layer of dielectric or insulation, a seed layer (not shown) can be deposited over the barrier layer. A seed layer can be deposited using a sputter chamber or an Ion Metal Plasma (IMP) chamber at a temperature of between about 0 and 300 degrees C.—and a pressure of between about 1 and 100 mTorr, using copper or a copper alloy as the source at a flow rate of between about 10 and 400 sccm and using argon as an ambient gas. The minimum thickness of a seed layer is about 50 Angstrom, this thickness is required achieve a reliable gap fill.

Figure 10:
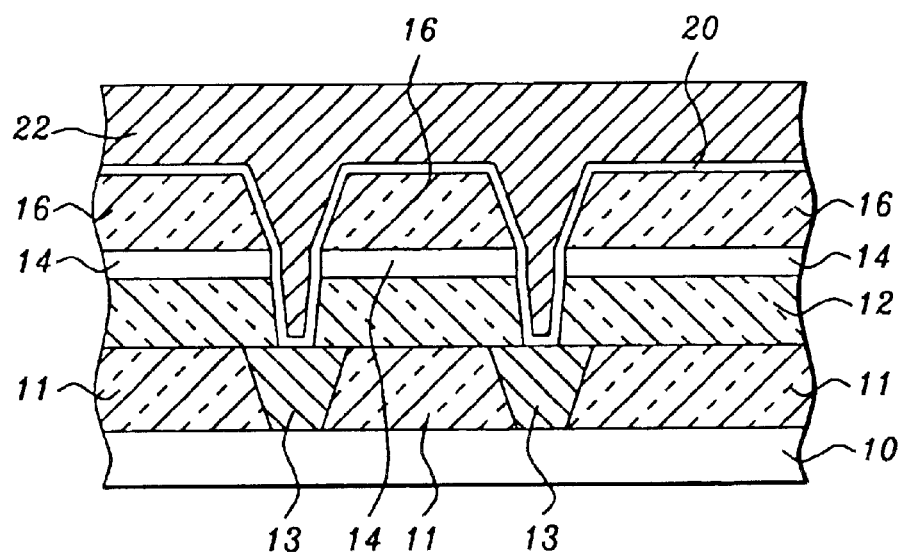
FIG. 10 shows a cross section after a layer of metal has been deposited over the surface of the barrier layer.

FIG. 10 shows a cross section after a layer 22 of copper has been deposited over the surface of the barrier layer 20, the layer 22 of copper can be deposited after a layer of copper seed has been deposited over the surface of barrier layer 20. The layer 22 of copper fills the openings 19 that previously have been created in the third and second layers of dielectric and contacts the partially exposed surface of the points of electrical contact 13. The layer 18 of copper can be deposited using conventional methods of Electro Chemical Plating (ECP).

Figure 11:
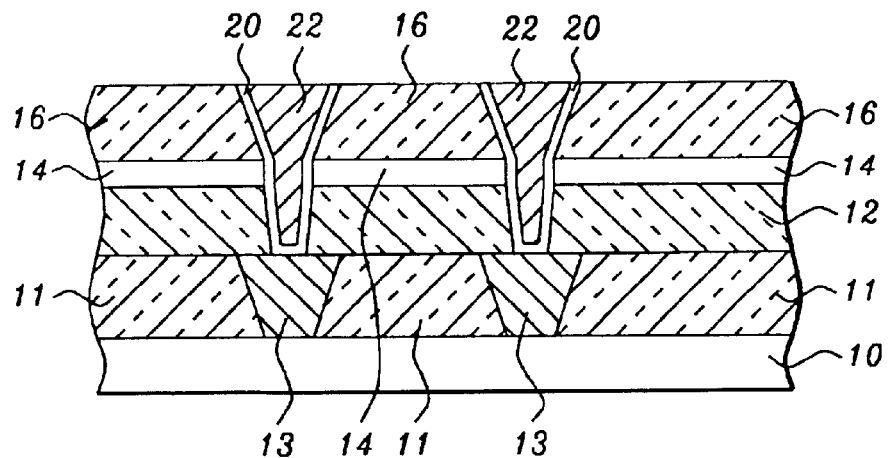
FIG. 11 shows a cross section after the deposited layer of metal has been polished down to the surface of the third layer of dielectric.

As a final processing steps in the creation of the copper metal structure of the invention, a cross section after the layer 22 of copper has been polished is shown in FIG. 11. Conventional methods of Chemical Mechanical Polishing (CMP) can be used for this purpose, the copper is removed from above the surface of the second layer 14 of dielectric, in addition the layer 26 of barrier material is also removed from above the surface of the second layer of dielectric.

Several results have been obtained using the method to create copper interconnect structure of the invention, as follows:

interconnect plugs 13 have sloping sides, facing sides of adjacent interconnect plugs 13 are further removed from each other and therefore have reduced parasitic capacitance between these adjacent contact plugs 13 the lower sections of the interconnects 22, FIG. 11, that is the sections that are surrounded by the second layer 12 of dielectric, are essentially interconnect vias and have a smaller diameter and are therefore further removed from each other. This results in reduced electromagnetic coupling between these lower sections, and the upper sections of the interconnects 22, FIG. 11, that is the sections that are surrounded by the third layer 16 of dielectric, have sloping sides resulting in creating more distance between adjacent surfaces of these upper sections which in turn results in reduced electromagnetic interaction (and the therefrom resulting creation of eddy currents) between adjacent interconnections 28.

The three indicated aspects of the vertical interconnects 22/13 of FIG. 11 result in a reduction of the parasitic capacitance between adjacent interconnect lines which results in improved device performance, most notably at higher operating frequencies of the devices in which these interconnect lines are applied.

Figure 12:
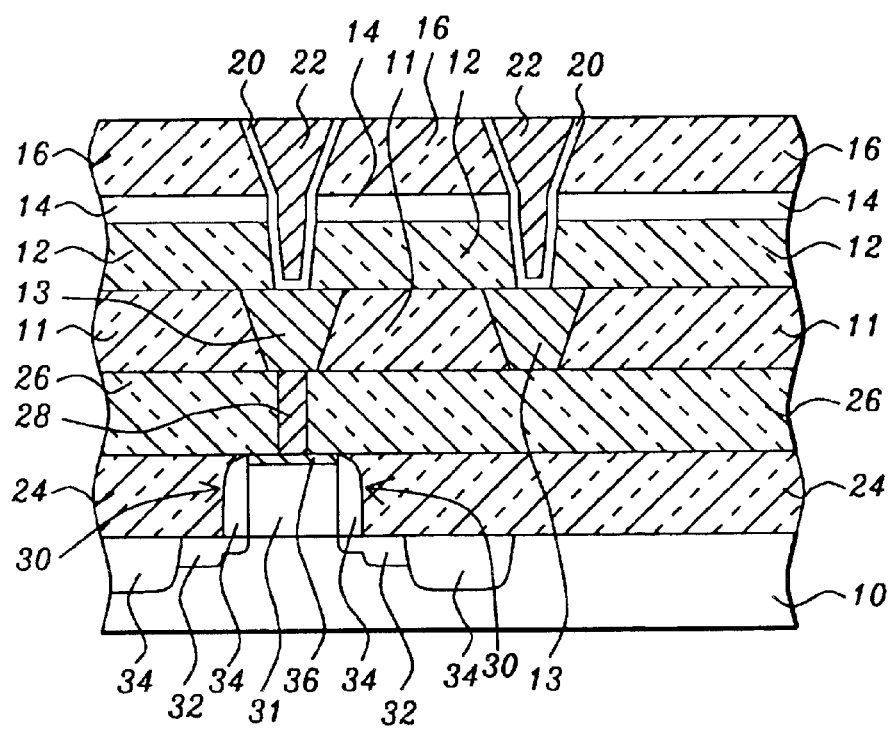
FIG. 12 shows a cross section of a typical application of the invention.

An application of the invention is shown in cross section in FIG. 12. Most of the elements that are shown in FIG. 12 have previously been highlighted and remain valid for the cross section that is shown in FIG. 12. Added elements that are shown in FIG. 12 are:

24, a layer of dielectric that has been deposited over the surface of semiconductor substrate 10

26, a layer of dielectric that has been deposited over the surface of layer 24; the two layers combined form what is typically referred to as the pre-metal dielectric (PMD)

34, regions of Shallow Trench Isolation that have been created in the surface of the substrate 10 in order to define that active surface regions of substrate 10

30, a typical gate electrode that has been created on the surface of substrate 10

31, the body of the gate electrode 30, tipically comprising polysilicon 32, the gate electrode 30 has been provided with self-aligned impurity implants into the surface of substrate 10 for source and drain regions of the gate electrode 34, gate spacers formed on the sidewalls of gate electrode 30

36, a salicided layer provided on the surface of polysilicon gate electrode 30

28, a contact plug through layer 26 of dieelctric that is in electrical contact with the salicided surface 36 of gate electrode 30.

The structure overlying layer 26 of dielectric is the now familiar interconnect structure of the invention. It is clear from the cross section that is shown in FIG. 12 that the vertical interconnect 22/13/28 provides a low capacitance interconnect on the surface of the layer 16 of dielectric with the underlying surface 36 of the gate electrode 30. The low capacitance interconnect 13/33 that overlies contact plug 28, in view of the fact that this is a reduced capacitance interconnect, provides the means of improving device performance.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A multilayer integrated circuit structure, comprising:

a semiconductor substrate having a surface, a plurality of semiconductor devices having been provided in or on the surface of said substrate, further conductive points of electrical contact having been provided in or on the surface of said substrate;

first metal plugs being provided on the surface of the substrate, said first metal plugs being imbedded in a first layer of dielectric deposited over the surface of said substrate, said first metal plugs being aligned with said conductive points of electrical contact having been provided in or on the surface of said substrate, said first metal plugs having a surface comprising a first surface area and a therein centrally located second surface area, said second surface being smaller than said first surface by a measurable amount;

a second layer of dielectric deposited over the surface of said first layer of dielectric, including the surface of said first metal plugs;

an etch stop layer deposited of the surface of said second layer of dielectric, said etch stop layer having been patterned and etched, creating openings in said etch stop layer that align with said second surface area of said first metal plugs, exposing the surface of said first layer of dielectric, said openings in said etch stop layer having a surface area that is about equal to said second surface area of said first metal plugs;

a third layer of dielectric deposited over the surface of said etch stop layer, including the exposed surface of said second layer of dielectric;

first openings created in said third layer of dielectric, said first openings having sloping sidewalls, said first openings in said third layer of dielectric having a surface area that is about equal to said first surface area of said first metal plugs, said first openings in said third layer of dielectric extending to said openings created in said layer of etch stop;

second openings created in said second layer of dielectric, said second openings having sloping sidewalls, said second openings in said second layer of dielectric extending from said openings created in said layer of etch stop to said second surface of said first metal plugs;

a barrier layer deposited over sidewalls of said first openings in said third layer of dielectric, over said second openings in said second layer of dielectric, over said second surface of said first metal plugs; and a layer of conductive material deposited over the surface of said barrier layer, excess conductive material having been removed from above the surface of said third layer of dielectric, furthermore said barrier layer having been removed from above the surface of said second layer of dielectric.

2. The structure of claim 1, with the addition of a seed layer deposited over the surface of said barrier layer, said seed layer equally having been removed from above the surface of said second layer of dielectric.

3. The structure of claim 1, said conductive points of electrical contact having been provided in or on the surface of said substrate comprising copper.

4. The structure of claim 1, said layer of conductive material deposited over the surface of said barrier layer comprising copper.

5. The structure of claim 2, said seed layer comprising copper.

* * * * *